United States Patent
Bogi et al.

(10) Patent No.: US 10,516,386 B1
(45) Date of Patent: Dec. 24, 2019

(54) CIRCUIT FOR CONTROLLING SHAPE OF A DRIVER SIGNAL WAVEFORM

(71) Applicant: Arm Limited, Cambridge (GB)

(72) Inventors: Seshagiri Rao Bogi, Bangalore (IN); Mikael Yves Marie Rien, Bernin (FR); Ranabir Dey, Bangalore (IN); Vijaya Kumar Vinukonda, Bangalore (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/153,055

(22) Filed: Oct. 5, 2018

(51) Int. Cl.
| | |
|---|---|
| *H03K 3/037* | (2006.01) |
| *G06F 13/42* | (2006.01) |
| *H03K 17/687* | (2006.01) |

(52) U.S. Cl.
CPC ............. *H03K 3/037* (2013.01); *G06F 13/42* (2013.01); *H03K 17/6871* (2013.01); *G06F 2213/0016* (2013.01)

(58) Field of Classification Search
CPC .. H03K 3/037; H03K 3/0375; H03K 17/6871; H03K 17/687; G06F 13/42; G06F 13/4282; G06F 2213/0016
USPC ........ 327/108–112, 427, 434, 437, 180, 309, 327/312, 313, 321, 315, 316, 318, 319, 327/379, 333; 326/82, 83, 87
See application file for complete search history.

(56) References Cited

U.S. PATENT DOCUMENTS 7,068,098 B1 * 6/2006 Bell .......................... H03F 1/42
327/309

OTHER PUBLICATIONS

UM10204 I2C-bus Specification and User Manual; NXP Semiconductors; Rev. 6; Apr. 4, 2014.

* cited by examiner

*Primary Examiner* — Tomi Skibinski
(74) *Attorney, Agent, or Firm* — Pramudji Law Group PLLC; Ari Pramudji

(57) ABSTRACT

Briefly, embodiments of claimed subject matter relate to controlling a voltage across a circuit element utilized in a pre-driver for a bidirectional communications bus. In embodiments, a voltage control circuit may be utilized to reduce electrical stress across a capacitor coupled to the pre-driver to the communications bus. The voltage control circuit may operate to provide a voltage to a middle point between two capacitors, of a plurality of capacitors, which may operate to limit voltage across one or more capacitors to below a predetermined limit.

19 Claims, 6 Drawing Sheets

CIRCUIT FOR CONTROLLING SHAPE OF A DRIVER SIGNAL WAVEFORM

TECHNICAL FIELD

This disclosure relates to electronic circuits, which may operate to control the shape of an output signal waveform, such as a waveform generated by a driver of a communications bus.

BACKGROUND

In a computing device, such as a laptop or desktop computer, smart phone, gaming device, etc., a communications bus may be implemented between various integrated circuit wafers that form the computing device. The communications bus may enable a system designer, for example, to verify operations and to troubleshoot functions of the integrated circuits that form the computing device. In one integration scenario, a designer may incrementally add an integrated circuit to a circuit board and then utilize a communications bus to confirm operation of the newly-added integrated circuit. A communications bus that exemplifies such capabilities may be the inter-integrated circuit bus, which may be abbreviated as "IIC" or "I²C," developed by the Philips company (i.e., Koninklijke Philips N.V.) of Amsterdam, Netherlands, for example, although other varieties of communications buses may be utilized to provide such capabilities.

However, under certain modes of operation, such as operation of the communications bus at increased voltages or increased speed, or a combination thereof, driver circuits of the communications bus may undergo increased electrical stress. Such increased electrical stress may be brought about especially when driver circuits are pushed to provide output signal waveforms that comply with strict criteria. Forcing driver circuitry to operate in accordance with these criteria may give rise to reduced operating life, for example, which may result in degraded operation of a communications bus. In other instances, increased electrical stress may bring about complete failure of a communications bus well before expiration of its expected lifespan. Thus, providing techniques and/or circuitry that may operate to reduce electrical stress on driver circuitry of a communications bus, operating in accordance with strict criteria, continues to be an active area of investigation.

BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

Figure 1:
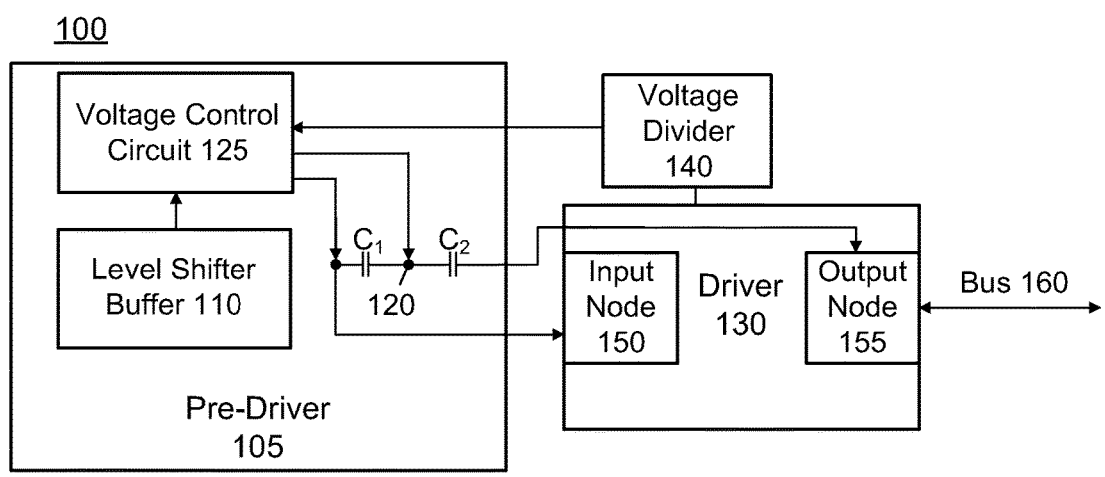
FIG. 1 is a block diagram illustrating a circuit for controlling the shape of a driver signal waveform with reduced component electrical stress, in accordance with various embodiments described herein.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

As previously discussed, in a computing device, such as a laptop or desktop computer, smart phone, gaming device, or an embedded or special-purpose computer, for example, a communications bus may be implemented between various integrated circuit wafers that form the computing device. The communications bus may enable a system designer, for example, to verify operations, change operating modes of one or more integrated circuits, and/or to troubleshoot functions of the integrated circuits that constitute the computing device. In one scenario, a developer may incrementally add an integrated circuit to a circuit board during an integration phase and then utilize the communications bus to confirm operation of the newly-added integrated circuit. In the event that the newly-added integrated circuit does not perform one or more intended functions, a developer may utilize a communications bus to place newly-added circuit into a test or troubleshooting mode. After successful troubleshooting, a bus controller may instruct an integrated circuit to exit a testing or troubleshooting mode and resume normal operation, for example. A communications bus that exemplifies such capabilities may be the inter-integrated circuit bus (e.g., the "IIC" bus or "I²C" bus), although claimed subject matter is intended to embrace communications buses of various types, such as a Universal Serial Bus (USB) or variations thereof.

However, under certain modes of operation of a communications bus, such as an operating mode involving use of an increased voltage level or an increased data rate, or a combination thereof, driver circuits of the communications bus may undergo increased electrical stress. As an example, responsive to use of an increased voltage level, a passive component, such as a capacitor coupled to an output node of a communications bus driver, may exhibit increased internal temperature, breakdown of a dielectric material, and/or experience other negative consequences. Such increased electrical stress may be intensified when driver circuits are required to provide output signal waveforms that comply with strict timing criteria in connection with voltage rise time and/or voltage fall time. Thus, during these instances, and potentially others, increased electrical stress brought about by requiring operation within strict voltage and/or timing limits may give rise to reduced operating life of driver components, which may result in degraded operation of a communications bus. In other instances, increased electrical stress, may lead to a shortened lifespan of a communications bus. Such shortened lifespan may additionally bring about damage to other devices that may rely on parameters conveyed by a communications bus.

As will be described further herein, particular embodiments of claimed subject matter may relate to a pre-driver, which may be configured to perform voltage control functions, such as maintaining a voltage at a middle node between two capacitors, to a level of less than a predetermined level. Thus, in particular embodiments that utilize a supply voltage of 1.8 VDC, a pre-driver may limit a voltage between two capacitors to a level that does not exceed about 110% of a supply voltage, such as a level of 1.98 VDC (e.g., 1.8 V+0.18 V). In one embodiment, as described herein, such limiting of a voltage between two capacitors, may be brought about by performing a switching function to permit a voltage to be applied to a middle node disposed between the two capacitors. Such application of a voltage to the middle node disposed between two capacitors may occur as voltage of a communications bus, which may be coupled to a capacitor at an end opposite the middle node, rises to a relatively high level. Thus, when a communications bus voltage achieves a relatively high level, such as 3.3 V, for example, a voltage of 1.8 V may be rapidly applied to the middle node, so as to maintain a maximum voltage difference that does not exceed, for example, 1.98 V DC. Thus, when implemented utilizing metal oxide metal (MOM) capacitors, metal-insulator-metal (MIM) capacitors, or MOS device capacitors, a voltage control circuit may ensure that a voltage across a capacitor does not approach a level that may bring about increased thermal stress, dielectric breakdown, or other undesirable consequence. Such an arrangement may provide one or more advantages over alternative arrangements, which may include applying a voltage, such as 1.8 V, to a middle node between two capacitors.

A pre-driver may additionally operate to control aspects of the shape of an output signal waveform, such as a slew rate of a rising portion of an output signal waveform and/or a falling portion of an output signal waveform. Under such conditions, a pre-driver may operate to transition a switch, such as a transistor switch, which may be coupled to a middle node between two capacitors, to an "off" state. In one embodiment, via transitioning the switch to an "off" state, a voltage level of a communications bus coupled to a capacitor at an end opposite the middle node may adhere to a substantially linearly decreasing profile that complies with output signal waveform boundaries that define slew rate requirements. In another embodiment, a decreasing voltage may exhibit a slew rate, which may be expressed as a transition time, of between 10.8 ns and 120.0 ns when measured as a signal transitions from a level of approximately 70.0% of a logic "1" to a level of 30.0% of a logic "1". It should be noted, however, that claimed subject matter is intended to embrace pre-driver voltage control circuits that bring about a wide variety of other slew rates of a falling portion of an output signal waveform, virtually without limitation.

Before discussing particular embodiments in reference to the accompanying figures, a brief description of various nonlimiting embodiments is provided. For example, one embodiment may include a pre-driver comprising a control circuit configured to control the shape of an output signal waveform (e.g., a slew rate of a falling portion of an output signal waveform). The control circuit may comprise a plurality of capacitors, which may be coupled in series, wherein an output node of one of the plurality of capacitors is coupled to a driver output node that provides an output signal waveform. The control circuit may additionally comprise a voltage control circuit, which may be coupled to a node, such as a middle node between two capacitors of the plurality of capacitors. The voltage tracking circuit may be configured to maintain a voltage at the node between the two of the plurality of capacitors to be less than a predetermined level. In one embodiment, the predetermined level may correspond to a voltage supply voltage level of 1.8 V+10.0%, which corresponds to an upper threshold of 1.98 V.

In another embodiment, a method for controlling the shape of an output signal waveform, such as a slew rate of a falling portion of an output signal waveform, may comprise sensing a signal level in a pre-driver portion of a driver circuit. The method may further comprise driving a switching device, wherein the switching device may be coupled to a node between two capacitors, of a plurality of capacitors coupled in series, to an "on" state responsive to receiving a signal from a node of the pre-driver portion. The method may further comprise, responsive to driving the switching device to the "on" state, allowing an output signal waveform at the node between the two capacitors of the plurality of capacitors to attain a voltage less than a determined level.

In another embodiment, a circuit may comprise a plurality of series-coupled capacitors, wherein a node between two of the plurality of series-coupled capacitors may operate to control the shape, which may encompass a slew rate of a rising portion or a falling portion, of an output signal waveform from the circuit. The method may further comprise a voltage tracking circuit coupled to the node between the two of the plurality of capacitors, wherein the voltage control circuit may be configured to maintain a voltage level at the node between the two of the plurality of capacitors to be within + or −10.0% of the first supply voltage (such as 1.8 V) of the voltage control circuit.

In the context of the present disclosure, the shape of an output signal waveform for transmission along a communications bus may accord with one or more specifications. Thus, in particular embodiments, the shape of an output signal waveform may relate to a slew rate of an output waveform. A slew rate may be defined as a rate, such as a maximum rate, at which a driver is capable of responding to an abrupt change in an input signal level. Thus, it may be appreciated that when a pre-driver, for example, provides a pulse-shaped signal at an input node of a driver for a communications bus that exhibits a primarily reactive impedance (e.g., capacitive), a voltage present at an output node of the driver may exhibit a gradual increase in amplitude followed by a gradual decrease in amplitude. Additionally, as a reactive load (such as capacitance) of a communications bus increases, a pulse-shaped input signal may bring about an output signal waveform exhibiting a more gradual increase in amplitude followed by a more gradual decrease in amplitude.

Particular embodiments will now be described with reference to the figures, such as FIG. 1, which provides a block diagram 100 illustrating a circuit for controlling the shape of a driver signal waveform with reduced component electrical stress, in accordance with various embodiments described herein. In FIG. 1, pre-driver 105, which may comprise a voltage control circuit 125 and level shifter buffer 110, may cooperate with driver 130, so as to receive and transmit binary encoded parameters utilizing bidirectional communications bus 160. In particular embodiments, communications bus 160 may be maintained at a voltage level above a reference voltage level, such as, for example, 1.0 V, 1.8 V, 3.3 V, 5.0 V, and so forth. In certain embodiments, communications bus 160 may comprise a plurality of electrical conductors, in which an information signal may be generated, such as by way of driver 130, by momentarily lowering a potential of a first conductor, of the plurality of conductors, to correspond to a reference potential, for example. When a voltage signal is available on communications bus 160, such as at output node 155, voltage divider 140 may supply one or more voltage signals to a voltage control circuit 125, which may be used to perform switching operations, such as those described herein. In one particular embodiment, communications bus 160 may comprise an $I^2C$ bus, although claimed subject matter is intended to embrace a wide variety of communications bus structures virtually without limitation.

Communications bus 160 may operate according to particular specifications, such as described in Table I, herein, for voltage signaling levels, timing constraints, signal waveform shapes (e.g., rise and fall times of communication signals). In particular embodiments, devices which operate utilizing communications bus 160, such as pre-driver 105 in cooperation with driver 130, may generate waveforms in accordance with one or more requirements for slew rate of an output signal. Thus, in one embodiment, a slew rate may be expressed as a range of time periods within which an amplitude of an output signal waveform is to fall from a nominal level, such as 1.8 V, 3.3 V, etc., to a level that approaches a reference level. In another embodiment, a slew rate may be expressed as a range of time periods within which amplitude of an output signal waveform is to fall from a level approximately equal to 70.0% of a nominal value to a level approximately equal to 30% of a nominal value. Thus, in one embodiment, for an input signal clocked at 1.0 MHz, driver 130 may be specified to exhibit a fall-time slew rate of between about 10.8 nanoseconds to about 120.0 nanoseconds. In another embodiment, driver 130 may be specified to exhibit a rise-time slew rate of between about 20.0 nanoseconds to about 300.0 nanoseconds. Under these conditions, bus 160 may comprise a primarily reactive load, such as a capacitance of between about 10.0 pF and about 550.0 pF utilizing a pull up resistance of between 161.5Ω and about 7.2 kΩ. It should be noted, however, that claimed subject matter is intended to embrace a wide variety of slew rate values as these pertain to output signal waveform rise-times, fall-times, pull-up resistances, reactive loads presented by bus 160, voltage levels, and so forth.

In accordance with conventional approaches, when communications bus 160 transitions from a reference level to a relatively high level, such as, for example, 3.3 V, such voltage may be present at input node 150. Accordingly, at least in certain instances, a voltage difference may exist between, input node 150 and middle node 120, which corresponds to a voltage across capacitor $C_2$. At times, it may be possible for a voltage difference across capacitor $C_2$ to exceed a predetermined threshold, such as 1.98 V. Under certain circumstances, when a voltage difference across capacitor $C_2$ exceeds 1.98 V, such voltage may bring about electrical stress on capacitor $C_2$, which, as previously mentioned herein, may bring about increased internal temperature of capacitor $C_2$, breakdown of a dielectric material, or other undesirable consequence.

Accordingly, certain embodiments of claimed subject matter may operate to preclude voltage differences across capacitor $C_2$ from exceeding a predetermined value when input node 150 and/or output node 155 comprise a relatively high level. Such limiting of a voltage difference across capacitor $C_2$ may be provided even when a supply voltage to pre-driver 105 drops to a reference voltage and output node 150 comprises a relatively high level, such as 3.3 V. In accordance with particular embodiments, a switching device of voltage control circuit 125 may apply a positive (e.g., greater than 0.0) voltage to middle node 120. For example, in one embodiment, when voltage control circuit 125 generates a voltage of 1.8 V and when a voltage of 3.6 V is present at input node 150, a voltage difference across capacitor $C_2$ may be limited or constrained to nominal levels, such as within 10.0% of 1.8 V. Further, even in the presence of voltage transients, which may occur as a voltage accumulates across capacitor $C_2$, a voltage difference across capacitor $C_2$ may be maintained at a level of less than, for example, 1.98 V (e.g. 1.8 volt+10.0%). However, claimed subject matter is intended to embrace a wide variety of different voltage levels present at input node 150 as well different voltage levels applied by voltage control circuit 125 to middle node 120.

In particular embodiments, when communications bus 160 transitions from a relatively high level to a lower level, such as a reference level, voltage control circuit 125 may be utilized to bring about such a transition within slew rate limits. For example, under circumstances wherein communications bus 160 exhibits a primarily reactive load, such as a capacitance of between 10.0 pF and 550.0 pF, switching of bus 160 from a 3.3 volt level to a reference voltage may utilize a Miller capacitance of a transistor of driver 130. Under such circumstances, utilizing the Miller capacitance may bring about a substantially linearly-decreasing voltage at output node 155. Utilizing the Miller capacitance may bring about other consequences, and claimed subject matter is not limited in this respect.

Figure 2:
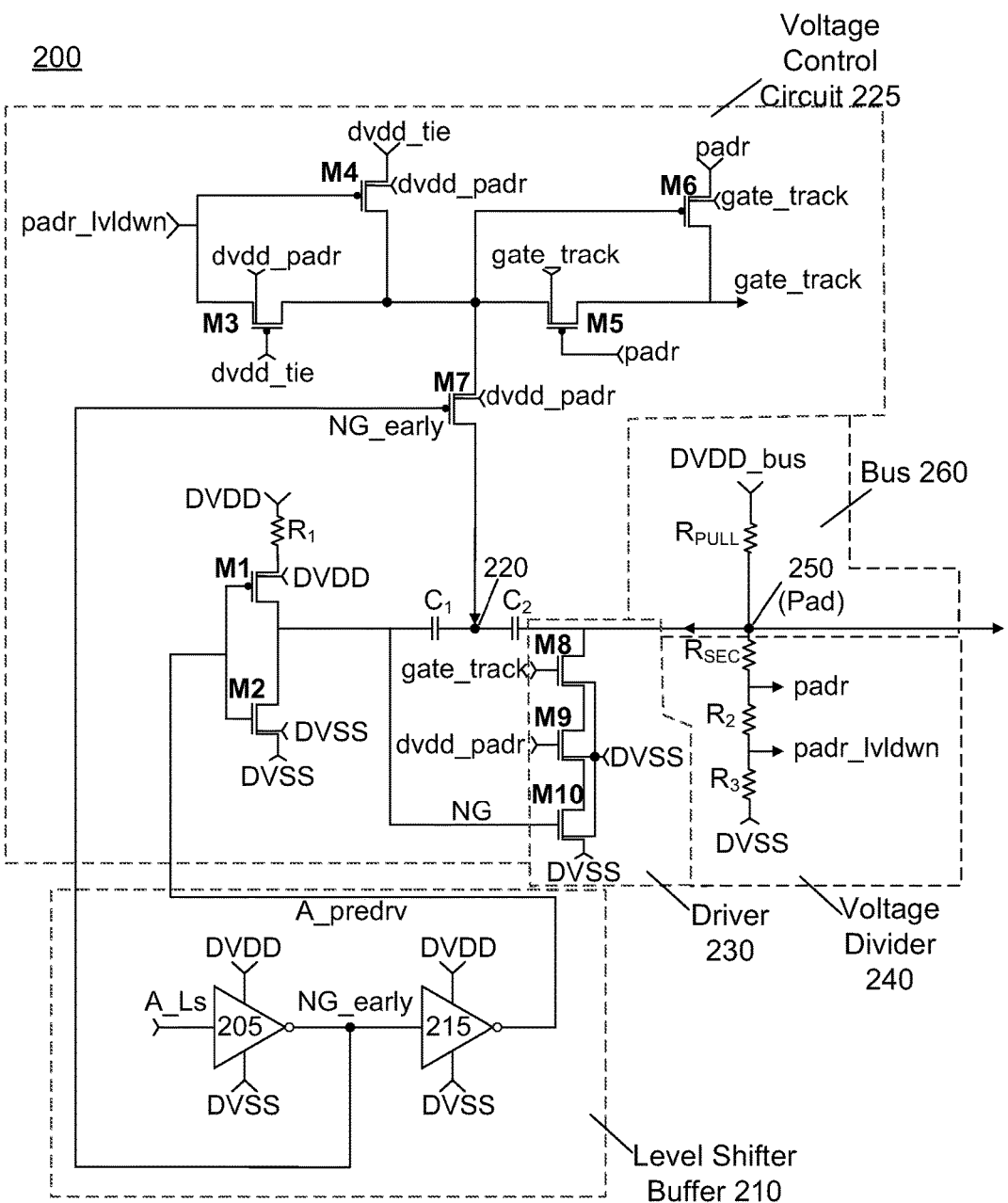
FIG. 2 is a schematic diagram illustrating a circuit for controlling the shape of a driver signal waveform with reduced component electrical stress, according to an embodiment.

FIG. 2 is a schematic diagram 200 illustrating a circuit for controlling the shape of a driver signal waveform with reduced component electrical stress, according to an embodiment. In FIG. 2, level shifter buffer 210 may correspond to level shifter buffer 110 of pre-driver 105 shown in FIG. 1. Voltage control circuit 225 may correspond to a voltage control circuit 125 also of pre-driver 105, such as shown in FIG. 1. Driver 230 of FIG. 2 may correspond to driver 130, such as shown in FIG. 1. Voltage divider 240 may correspond to a voltage divider 140, and bus 260 may correspond to bus 160, such as shown in FIG. 1. It should be noted that the components identified in FIG. 2, such as transistors M1-M10, inverters 205 and 215, as well as resistances $R_1$, $R_2$, $R_3$, $R_{PULL}$, and $R_{SEC}$ represent one implementation of numerous possible implementations, which may form the system-level entities shown in FIG. 1.

In schematic diagram 200, inverter 205 of level shifter buffer 210 may operate to perform one or more level translation functions of an incoming signal, such as signal A_Ls. By way of inverter 205, incoming signal A_Ls may be inverted to form signal NG_early, which may be utilized to control the "on" or "off" state of PMOS transistor M7. Thus, when signal A_Ls comprises a binary logic value of "1," signal NG_early may convey a voltage corresponding to a binary logic "0" to the gate of PMOS transistor M7. Responsive to a binary logic "0" at the gate, PMOS transistor M7 may transition to an "on" state, thereby permitting an electric current to be conducted through PMOS transistor M7 in the direction of node 220. Such current conduction through PMOS transistor M7 may increase the voltage at node 220, such as to a level of signal dvdd_padr.

In schematic diagram 200, signal dvdd_padr may comprise a voltage level generated responsive to PMOS transistor M3 or PMOS transistor M4 being switch to an "on" state. Such switching of transistors M3 and/or M4 may be based at least in part on a voltage level of either signal padr_lvldwn or signal dvdd_tie. With respect to signal padr_lvldwn, when signal DVDD_bus, which corresponds to a pull-up voltage of bus 260, comprises a reference potential (e.g., signal ground) PMOS transistor M4 may be switched to an "on" state, thus permitting an electric current to be conducted transistor M4. Accordingly, a voltage of signal dvdd_padr may comprise a level similar to a voltage of signal dvdd_tie, which may be derived from voltage control circuit supply voltage DVDD. Alternatively, when signal padr_lvldwn comprises a voltage level greater than the reference potential (wherein a level of signal padr_lvldwn is related to a voltage of pad 250 as determined by voltage divider 240) and when signal dvdd_tie comprises a reference voltage, PMOS transistor M3 may be switched to an "on" state and signal dvdd_padr may comprise a level similar to signal padr_lvldwn. Thus, it may be appreciated that signal dvdd_padr may comprise a level that approaches 1.8 V when one or more of signal dvdd_tie or signal padr_lvldwn comprise levels of approximately 1.8 V, for example. Hence, responsive to a presence of a voltage approximately equal to 1.8 V at node 220, even if a voltage at pad 250 were to comprise a level of, for example, 3.3 V, a nominal voltage of 1.5 V (3.3 V–1.8 V) would be present across capacitor $C_2$.

Returning to level shifter buffer 210, signal NG_early may be inverted via inverter 215 to form signal A_predrv, which may be conveyed to an input node of a CMOS inverter formed by PMOS transistor M1 and NMOS transistor M2. It may be appreciated from schematic diagram 200 that signal A_predrv may permit an output signal of the inverter formed by PMOS transistor M1 and NMOS transistor M2 to comprise a level that switches between values of supply voltage DVDD, which corresponds to the supply voltage of voltage control circuit 225, and DVSS, which corresponds to the reference voltage of voltage control circuit 225.

As shown in schematic diagram 200, PMOS transistors M5 and M6 may operate to provide signal gate_track to NFET transistor M8. Thus, when signal padr comprises a reference voltage level, for example, PMOS transistor M5 may be switched to an "on" state, thereby allowing signal gate_track to comprise a voltage level at least substantially similar to the level of signal dvdd_padr. Consequently, when signal gate_track comprises such a voltage level, NFET transistor M8 may be switched to an "on" state. Thus, even when signal dvdd_padr and signal NG comprise a voltage levels sufficiently high to switch NFET transistors M9 and M10 into an "on" state, and when a voltage at pad 250 comprises a level of, for example, 0.0 V, a nominal voltage of 1.8 V (dvdd_padr) is present across the capacitor $C_2$.

Alternatively, when signal padr comprises a voltage level sufficiently high to place PMOS transistor M5 into an "off" state, signal dvdd_padr maintains PMOS transistor M6 in an "on" state. Accordingly, with PMOS transistor M6 in an "on" state, signal gate_track comprises a reference level. Thus, NFET transistor M8 may remain in an "on" state, thereby maintaining a nonzero voltage at pad 250. Accordingly, a voltage across capacitor $C_2$ may be limited to a value of 1.5 V (3.3 V–1.8 V).

Figure 3:
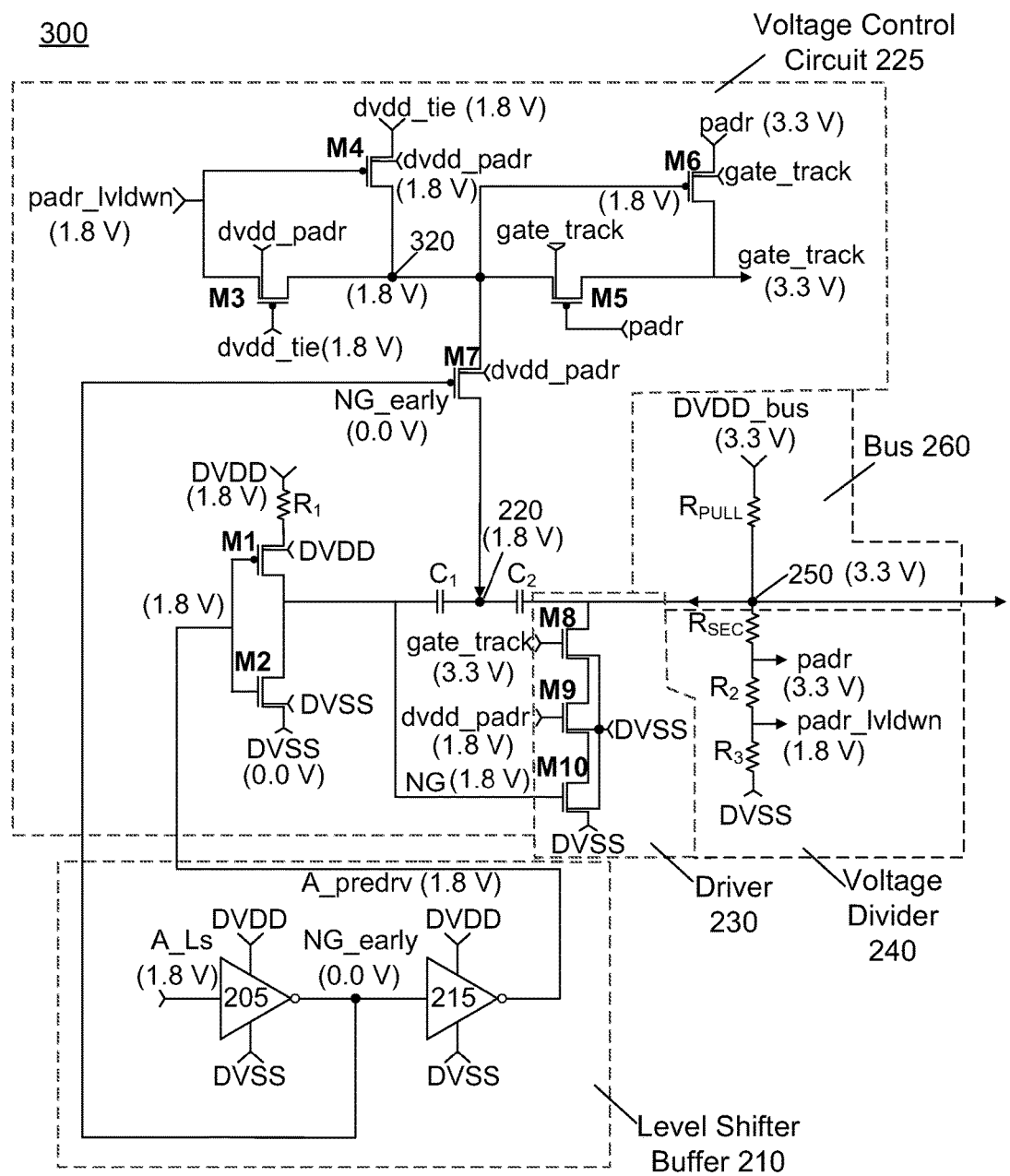
FIGS. 3-5 are schematic diagrams of the circuit illustrated in FIG. 2, showing signals comprising various voltage levels generated responsive to voltage input signals, according to an embodiment.

FIG. 3 is a schematic diagram (300) of the circuit illustrated in FIG. 2, showing various voltage output signals generated responsive to voltage input signals, according to an embodiment. In an initial state, prior to the presence of input signal A_Ls at an input side of inverter 205, pad 250 may be placed in a quiescent state, wherein pad 250 comprises a voltage level of approximately 0.0 V. As shown in FIG. 3, responsive to input signal A_Ls comprising a level of 1.8 V, inverter 205 may generate an output signal, such as signal NG_early, comprising a level of approximately 0.0 V. Signal NG_early may be conveyed to PMOS transistor M7, which may permit a current to flow through transistor M7. Based, at least in part, on pad 250 comprising a voltage of approximately 0.0 V, signal padr_lvldwn may also comprise a voltage level of approximately 0.0 V. Accordingly, in view of a presence of a 0.0 V signal at the gate of PMOS transistor M4, signal dvdd_padr, which may comprise a level of approximately 1.8 V, may be conveyed to node 220 at a middle point between capacitors $C_1$ and $C_2$. Responsive to node 220 comprising a voltage of approximately 1.8 V, when the voltage of pad 250 is raised to a relatively high level, such as 3.3 V, the voltage across capacitor $C_2$ may be limited to a nominal level of, for example, 1.5 V. Additionally, responsive to pad 250 comprising a significant capacitive component, such as a capacitance that may approach 550.0 pF, it may be appreciated that the node 220 may comprise a level of 1.8 prior to pad 250 attaining a level of 3.3 V. Thus, at least in particular embodiments, the voltage across capacitor $C_2$ may be maintained at a voltage approximately equal to 1.8 V (e.g., 1.8 V±10.0%). Further, responsive to the signal padr comprising a level of 0.0 V, a current may be conducted through PMOS transistor M5. Accordingly, signal gate_track may attain a voltage level sufficient to permit current conduction through NFET transistor M8. Additionally, responsive to signal dvdd_padr comprising a level of 1.8 V, and responsive to a presence of a signal comprising approximately 1.8 V at node 220, NFET transistors M9 and M10 may permit current conduction as well. Accordingly, a voltage swing of pad 250 responsive to signal A_predrv may be precluded from generating a voltage difference across $C_2$ that exceeds, for example, a nominal level of 1.5 V.

Figure 4:
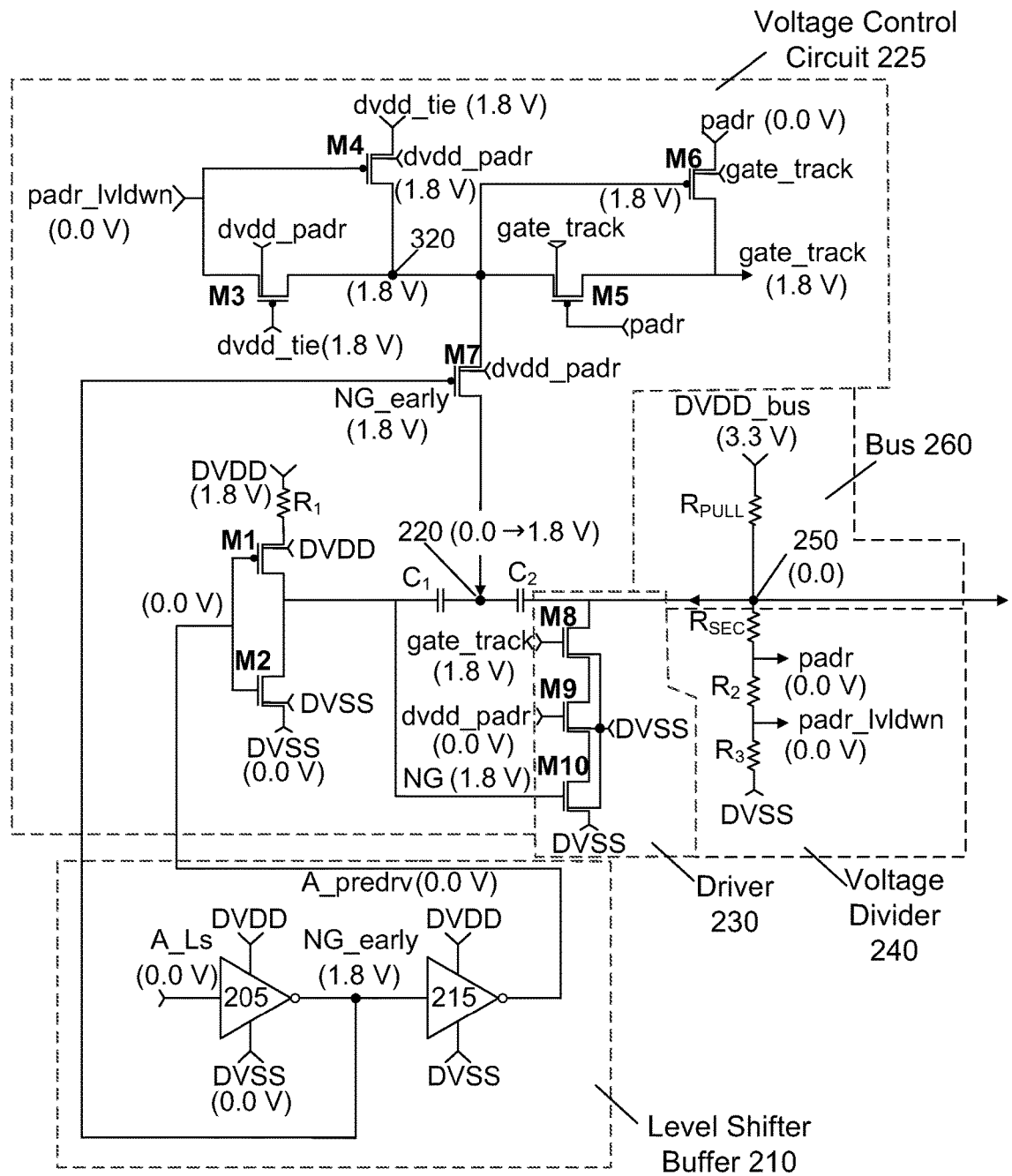

FIG. 4 is a schematic diagram (400) of the circuit illustrated in FIG. 2, showing various voltage output signals generated responsive to voltage input signals, according to an embodiment. In an initial state, prior to input signal A_Ls to inverter 205, pad 250 may be placed into a quiescent state, wherein pad 250 comprises a voltage level of approximately 0.0 V. As shown in FIG. 4, responsive to input signal A_Ls comprising a level of 0.0 V, inverter 205 may generate an output signal, such as signal NG_early, comprising a level of approximately 1.8 V. Signal NG_early may be conveyed to PMOS transistor M7, which may be placed into an "off" state wherein an appreciable current is not permitted to conduct through transistor M7. Accordingly, in view of PMOS transistor M7 being placed into an "off" state, node 220 may be permitted to fall to a level below 1.8 V, for example, which may include falling to a reference level, such as 0.0 V. Responsive to node 220 comprising a voltage of less than 1.8 V, and in response to the voltage of pad 250 comprising a level of 0.0 V, a voltage difference across capacitor $C_2$ may be precluded from attaining a level greater than 1.8 V (±10.0%) which corresponds to an upper threshold of 1.98 V. Additionally, responsive to the voltage padr comprising a level of 0.0, PMOS transistor M5 may permit a current to conduct. Accordingly, signal gate_track may attain a voltage level sufficient to permit current conduction through NFET transistor M8. However, responsive to signal dvdd_padr comprising a level of 1.8 V, NFET transistor M9 may remain in an "on" state. Accordingly, a voltage swing of pad 250 responsive to signal A_predrv does not produce a voltage difference across $C_2$ that exceeds, for example, a nominal level of 1.8 V (±10.0%).

Figure 5:
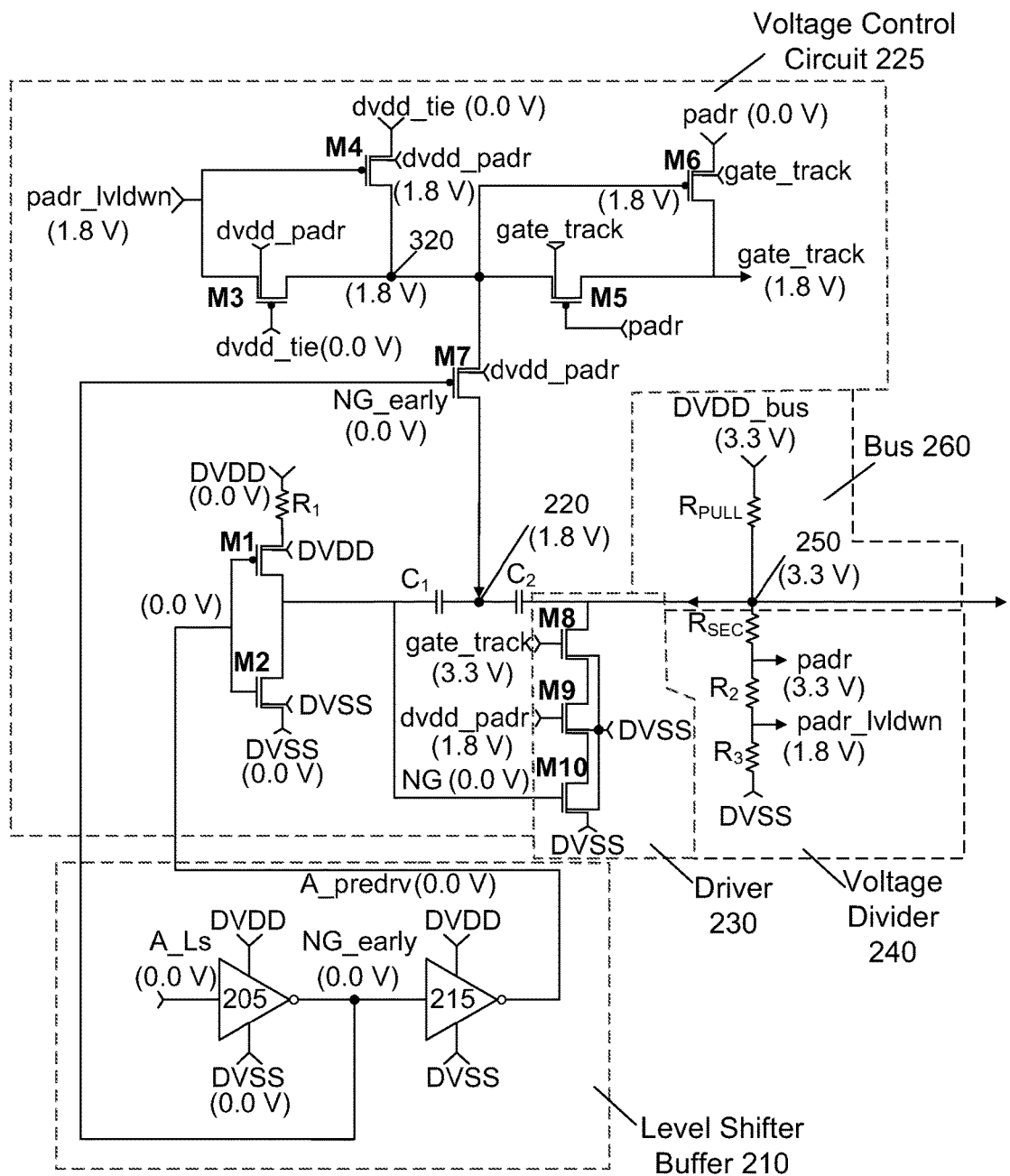

FIG. 5 is a schematic diagram (500) of the circuit illustrated in FIG. 2, showing various voltage output signals generated responsive to voltage input signals, according to an embodiment. In one embodiment, the voltage signal levels indicated in FIG. 5 may correspond to an "failsafe" condition wherein even though supply voltage DVDD may comprise a level of 0.0 V, while pad 250 comprises a voltage of 3.3 V, for example, voltage across capacitor $C_2$ may be maintained below a predetermined level, such as 1.8 V (±10.0%), which corresponds to an upper threshold of 1.98 V. It should be noted, however, that the claimed subject matter is intended to embrace limiting or controlling a voltage across capacitor $C_2$ to values other than 1.98 V, such as 2.0 V, 2.5 V, 3.0 V, 5.0 V, or any other voltage, virtually without limitation.

As shown in FIG. 5, responsive to supply voltage DVDD comprising 0.0 V, signal NG_early may comprise 0.0 V, thus placing PMOS transistor M7 into an "on" state. Thus, a current may be permitted to conduct through PMOS transistor M7. Additionally, responsive to signal padr_lvldwn, derived from voltage divider 240, comprising a level of 1.8 V, and responsive to signal dvdd_tie comprising a voltage level of approximately 0.0 V, signal dvdd_padr at node 320 may comprise a level of approximately 1.8 V. Thus, it may be appreciated that despite voltage swings of up to 3.3 V at pad 250, a voltage across capacitor $C_2$ may be maintained below a predetermined threshold such as, for example, less than approximately 1.8 V±10.0%, which corresponds to an upper threshold of 1.98 V.

Particular embodiments of claimed subject matter, such as those described with reference to FIGS. 2-5 may be utilized to shape output waveforms for use with communications buses compliant with one or more revisions of the I²C specification operating in for example, the Standard mode, the Fast mode, or the Fast mode Plus. Thus, for particular embodiments, Table I, below, provides operating frequencies, input capacitances, signal slew rate fall times, signal slew rate rise times, and possible ranges for $R_{PULL}$ of FIGS. 2-5.

| Frequency (kHz) | Capacitive Loading | Slew Rate Fall Time (70% to 30%) | Slew Rate Rise Time (30% to 70%) | $R_{PULLmin}$-$R_{PULLmax}$ |
|---|---|---|---|---|
| 1000 (kHz) | 10.0 pF | 10.8-120.0 ns | <120.0 ns | 161.5 Ω-7.2 kΩ |
| 1000 (kHz) | 400.0 pF | 10.8-120.0 ns | <120.0 ns | 161.5 Ω-345.0 |
| 1000 (kHz) | 550.0 pF | 10.8-120.0 ns | <120.0 ns | 161.5 Ω-253.0 |
| 400 (kHz) | 10.0 pF | 10.8-250.0 ns | 20.0-300.0 ns | 2.0 kΩ-17.0 kΩ |
| 400 (kHz) | 400.0 pF | 10.8-250.0 ns | 20.0-300.0 ns | 505.0 Ω-860.0 Ω |
| 100 (kHz) | 10.0 pF | <250.0 ns | <1000.0 ns | 1.077 kΩ-37.8 kΩ |
| 100 (kHz) | 400.0 pF | <250.0 ns | <1000.0 ns | 1.077 kΩ-2.8 kΩ |

Table I—I²C Communications Bus Frequency, Capacitance, Slew Rate, and $R_{PULL}$ Specifications Additionally, in one particular embodiment, resistor values utilized for voltage divider 240 and voltage control circuit 225 may correspond to values selectable for particular voltage division values.

Figure 6:
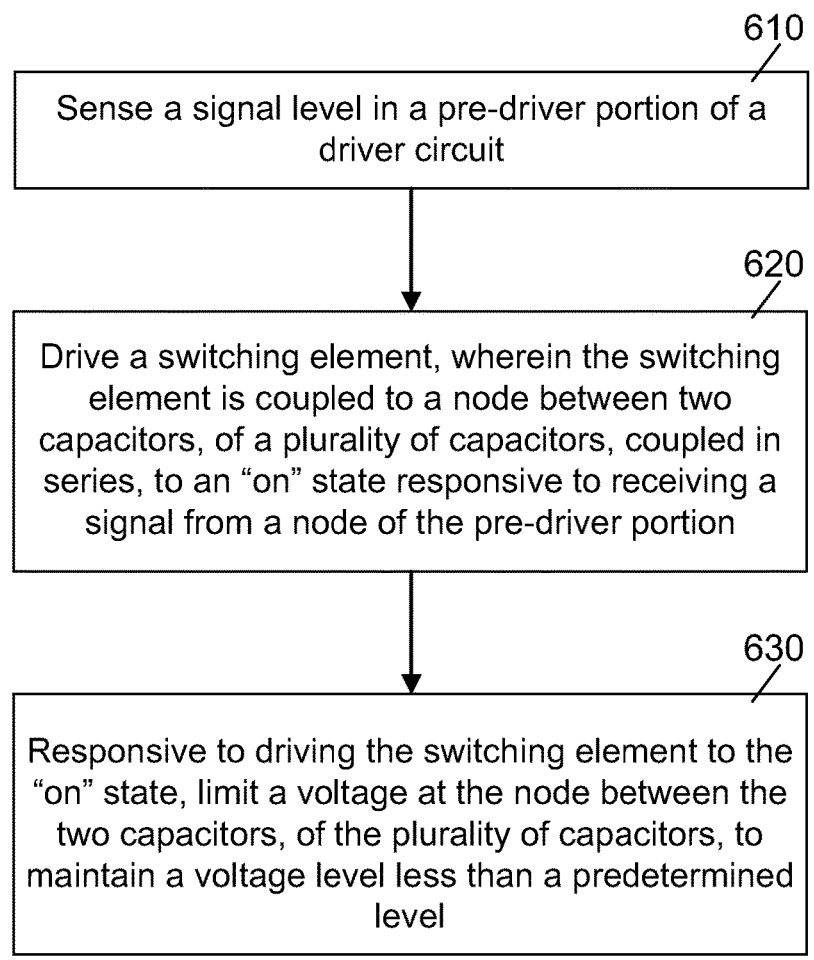
FIG. 6 is a flow chart for a method for controlling shape of a driver signal waveform, according to an embodiment.

FIG. 6 is a flow chart for a method 600 for controlling shape of a driver signal waveform according to an embodiment. Example implementations may include fewer blocks shown in FIG. 6 or blocks occurring in an order different than may be identified, or any combination thereof. The method of FIG. 6 may begin at block 610, which may comprise sensing a signal level in a pre-driver portion of a driver circuit. In one embodiment, sensing of a signal level may comprise a switching device, such as a gate of PMOS transistor M7, sensing signal NG_early comprising a value of approximately 0.0 V or approximately 1.8 V. The method may continue at block 620, which may comprise driving a switching device, wherein the switching device is coupled to a node between two capacitors, of a plurality of capacitors coupled in series, to an "on" state responsive to receiving a signal from a node of the pre-driver portion. In one embodiment, block 620 may be performed by a transistor, such as PMOS transistor M7. Responsive to a reference voltage being present at the gate of PMOS transistor M7, a signal dvdd_padr, may increase a voltage at a middle point between the two capacitors. The method may continue to block 630, which may comprise limiting, responsive to driving the switching device to the "on" state, the voltage at the node between the two capacitors, of the plurality of capacitors, to maintain a voltage level of less than a predetermined level. In certain embodiments, block 630 may comprise limiting a voltage difference of the cross capacitor $C_2$ to a value of less than approximately 1.8 V (±10.0%), which corresponds to an upper threshold of 1.98 V.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope of the invention as defined by the appended claims. For example, various combinations of the features of the dependent claims could be made with the features of the independent claims without departing from the scope of the present invention.

What is claimed is:

1. A circuit to control the shape of an output signal waveform, comprising:
   a plurality of capacitors coupled in series, wherein an output node of one of the plurality of capacitors is coupled to a driver output node that provides the output signal waveform; and
   a voltage control circuit:
      coupled to a node between two of the plurality of capacitors;
      coupled to a voltage divider that supplies one or more voltage signals to the voltage control circuit when a driver output node voltage signal is available; and
      configured to maintain a voltage at the node between the two of the plurality of capacitors to be less than a predetermined level.

2. The circuit of claim 1, wherein the predetermined level is about 1.98 V.

3. The circuit of claim 2, wherein the output signal waveform measured at the driver output node comprises a signal level of about 3.3 V when the predetermined level is about 1.98 V.

4. The circuit of claim 1, wherein the shape of the output signal waveform is measured at the driver output node, wherein the driver output node is coupled to a load comprising a capacitance of between about 10.0 pF and about 550.0 pF.

5. The circuit of claim 1, wherein the circuit to control the shape of the output signal waveform is configured to couple to an inter-integrated circuit (I²C) communications bus.

6. The circuit of claim 5, further comprising a switching device configured to control the shape of the output signal waveform, wherein the switching device is connected to the node between the two of the plurality of capacitors.

7. The circuit of claim 6, wherein the switching device is configured to control a slew rate fall time of the output signal waveform, during a transition from about 70.0% of a logic "1" to about 30.0% of a logic "1," to between about 10.8 ns to about 120.0 ns.

8. The circuit of claim 7, wherein the switching device is configured to control the slope of the output signal waveform to within substantially linearly decreasing boundaries.

9. A method of controlling the shape of an output signal waveform, comprising:
  sensing a signal level in a pre-driver portion of a driver circuit;
  driving a switching device to an "on" state responsive to receiving a signal from a node of the pre-driver portion, the switching device being coupled to a node between two capacitors of a plurality of capacitors coupled in series; and
  responsive to driving the switching device to the "on" state, controlling a voltage at the node between the two capacitors of the plurality of capacitors to maintain a voltage level of less than a predetermined level.

10. The method of claim 9, wherein the predetermined level is about 1.98 V.

11. The method of claim 10, wherein the output signal waveform comprises a transition time, corresponding to a transition from about 70.0% of a logic "1" to about 30.0% of a logic "1," of between about 10.8 ns to about 120.0 ns.

12. The method of claim 11, wherein slope of the output signal waveform is constrained to be within substantially linearly decreasing boundaries.

13. The method of claim 9, wherein the driver circuit operates to drive an I²C bus.

14. A circuit, comprising:
  a plurality of series-coupled capacitors, wherein a node between two of the plurality of series-coupled capacitors operates to control the shape of an output signal waveform from the circuit; and
  a voltage control circuit coupled to the node between the two of the plurality of capacitors, wherein the voltage control circuit is configured to maintain a voltage level at the node between the two of the plurality of capacitors to be within a threshold percentage of a first supply voltage of the voltage control circuit;
  wherein the voltage control circuit comprises a second supply voltage input derived from a voltage applied to a communications bus coupled to one of the plurality of series-coupled capacitors.

15. The circuit of claim 14, wherein the first supply voltage of the voltage control circuit comprises about 1.8 V, and wherein the second supply voltage of the voltage control circuit comprises about 3.3 V.

16. The circuit of claim 15, further comprising a voltage divider network to supply a plurality of voltages derived from the voltage of the communications bus.

17. The circuit of claim 14, wherein the voltage control circuit is configured to control a slew rate fall time of the output signal waveform, during a transition from about 70.0% of a logic "1" to about 30.0% of a logic "1," to between about 10.8 ns to about 120.0 ns.

18. The circuit of claim 17, wherein the slew rate of the output signal waveform is measured at a driver output node, wherein the driver output node is coupled to a load comprising a capacitance of between about 10.0 pF and about 550.0 pF.

19. The circuit of claim 14 wherein the slope of the output signal waveform is substantially linear.

* * * * *